(12) United States Patent
Daido

(10) Patent No.: US 6,548,766 B2
(45) Date of Patent: Apr. 15, 2003

(54) PRINTED WIRING BOARD FOR ATTACHMENT TO A SOCKET CONNECTOR, HAVING RECESSES AND CONDUCTIVE TABS

(75) Inventor: Yukiko Daido, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/921,202

(22) Filed: Aug. 1, 2001

(65) Prior Publication Data
US 2002/0020555 A1 Feb. 21, 2002

(30) Foreign Application Priority Data
Aug. 9, 2000 (JP) ........................................ 2000-240675

(51) Int. Cl.[7] .................................................. H05K 1/11
(52) U.S. Cl. ........................ 174/261; 174/255; 174/266; 361/767
(58) Field of Search ................................ 174/260, 261, 174/262, 263, 264, 265, 266, 255; 361/767, 768, 771

(56) References Cited
U.S. PATENT DOCUMENTS

| | | | | |
|---|---|---|---|---|
| 4,743,710 A | * | 5/1988 | Shieber et al. ............... | 174/261 |
| 5,342,999 A | * | 8/1994 | Frei et al. .................... | 174/260 |
| 5,621,193 A | * | 4/1997 | Isaak ........................... | 174/262 |
| 5,745,984 A | * | 5/1998 | Cole et al. ................... | 174/259 |
| 5,879,787 A | * | 3/1999 | Petefish ....................... | 174/256 |
| 5,958,600 A | * | 9/1999 | Sotokawa et al. ........... | 174/257 |
| 6,075,712 A | * | 6/2000 | McMahon ................... | 174/255 |
| 6,300,676 B1 | * | 10/2001 | Kawai ......................... | 257/678 |

* cited by examiner

Primary Examiner—Albert W. Paladini
Assistant Examiner—Jose H Alcala
(74) Attorney, Agent, or Firm—Lawrence R. Fraley

(57) ABSTRACT

A printed wiring board comprises an insulating layer having a plurality of recesses formed along a predetermined edge portion of the insulating layer to extend through a side surface of the insulating layer, tabs for establishing electrical connection with an external electronic apparatus and which are formed on a surface of the insulating layer along the predetermined edge portion in correspondence with the plurality of recesses, and extensions connected electrically to the respective tabs and extending into the respective recesses. The printed wiring board may further comprise a plurality of dummy pads which are buried under the insulating layer in correspondence with the tabs and the extensions and which are electrically insulated from each other. The extensions are joined to the dummy pads through the recesses. The resulting board comprises a structure in which tabs are not easily peeled from an insulating layer.

7 Claims, 16 Drawing Sheets

PRINTED WIRING BOARD FOR ATTACHMENT TO A SOCKET CONNECTOR, HAVING RECESSES AND CONDUCTIVE TABS

FIELD OF THE INVENTION

The present invention relates to printed wiring boards or cards and to methods of producing the same.

BACKGROUND OF THE INVENTION

FIG. 13 illustrates a printed wiring board (or card) 1 having, on an edge thereof, tabs (or board edge contacts) 2 for establishing an electrical connection between board 1 and an external electronic apparatus. Board 1 is pluggable into and unpluggable from an edge connector of such an external apparatus. Tabs 2 are typically formed as a part of a copper circuit pattern and plated (e.g., with gold) to prevent an oxide film from being formed.

As shown in FIGS. 14 and 15, board 1 is produced from a panel 3 of a sufficient size to produce at least one printing wiring board 1 therefrom. On panel 3 are formed at least one predetermined circuit pattern layer and one insulating layer (not shown). A set of tabs 2 is formed as a part of the copper circuit pattern, and each tab includes an associated extension 4 which is to be used in the plating process (e.g., with gold). Tabs 2 are electroplated by passing an electric current through extensions 4. On the surface of the circuit pattern (except tabs 2 and extensions 4), a protective film (plating resist) is adhered so as not to electroplate the surface. Panel 3 is then cut along the double dotted lines shown in FIG. 15 using a known machine so as to produce board 1 of a desired shape. Since extensions 4 become unnecessary after the plating process, most portions of extensions 4 are cut away from each respective tab 2.

In this cutting process, an end portion 5 of the extension lines 4 at the cutting position may be peeled from the surface of the respective insulating layer of board 1, as shown in FIG. 16. In addition, swarf and burrs of the conductor may often be left on the end portion of the conductor. The peeling of such a conductor can result in eventual inoperability of the printed wiring board 1.

Since tabs 2 of board 1 are directly inserted into an edge-type connector of an external apparatus and come into contact with fingers of the edge-type connector, tabs 2 are susceptible to being peeled off. Particularly in the case of a build-up type printed wiring board, tabs 2 may be peeled off due to a low bonding strength between the conductors (tabs 2) and the insulating layer. In addition, the peeling of the conductor may damage the finger itself. For these reasons, it is strongly desired to prevent the peeling of the conductor.

In order to hopefully avoid such an occurrence, an edge of the printed wiring board (card) 1 may be beveled as shown by numeral 6 in FIG. 17. This beveling process is carried out to prevent the peeling of conductor 5 and to remove burrs. In addition, the beveling is also effective to reduce the plugging and unplugging forces of the board within its respective receiving connector. However, such a beveling process requires additional manufacturing steps (and costs) to produce such a product.

OBJECTS AND SUMMARY OF THE INVENTION

A primary object of the present invention is to provide a printed wiring board having a structure in which tabs are not easily peeled away from the board's insulating layer.

Another object of the invention is to provide a method of producing such an advantageous product.

According to one aspect of the present invention, there is provided a printed wiring board comprising an insulating layer having a surface with a plurality of recesses therein, the recesses being formed along a predetermined edge portion of the insulating layer to extend through at least a portion of the insulating layer, a plurality of conductive tabs for establishing an electrical connection with an external electronic apparatus, selected ones of the tabs being formed on the surface of the insulating layer relative to a corresponding one of the recesses, and a plurality of conductive extensions located substantially on the surface of the insulating layer and being connected electrically to respective ones of the conductive tabs and extending into respective ones of the recesses.

According to another aspect of the invention, there is provided a method of making a printed wiring board comprising the steps of providing an insulating layer having a plurality of conductive tabs located thereon, forming a plurality of recesses within the insulating layer relative to the conductive tabs, forming conductive extensions which are connected electrically to the tabs and which extend within the recesses, and cutting the insulating layer along a predetermined line passing through the plurality of recesses.

BEST MODE FOR CARRYING OUT THE INVENTION

Embodiments of the printed wiring board and the method of producing the same will hereinafter be described in detail with reference to the accompanying drawings. Like numerals will be used to indicate like features.

Figure 1:
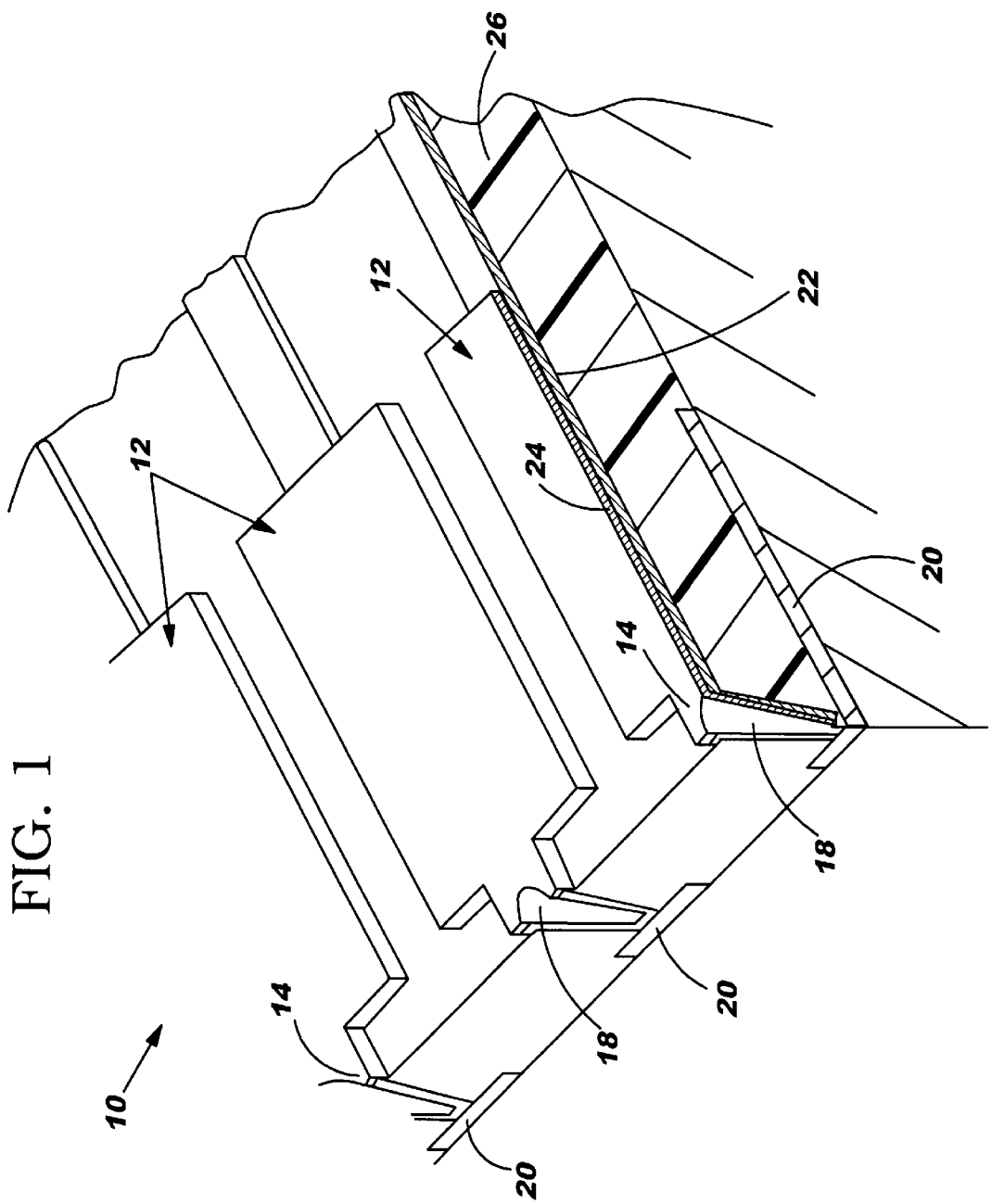
FIG. 1 is an enlarged perspective view of a main part of a printed wiring board according to the present invention.

As shown in FIG. 1, a printed wiring board 10 comprises an insulating layer 26, which is formed on a substrate (partially illustrated immediately below layer 26), having a plurality of recesses 18 formed along a predetermined edge portion of insulating layer 26 to extend through a side surface of insulating layer 26, tabs 12 for establishing an electrical connection with an external electronic apparatus and which are formed on a surface of insulating layer 26 along the predetermined edge portion in correspondence with the plurality of recesses 18, extensions 14 connected electrically to respective tabs 12 and extending into respective recesses 18, and dummy pads 20 which are buried under insulating layer 26. In this printed wiring board 10, extensions 14 are mechanically firmly joined to dummy pads 20 at the bottom of recesses 18. Each tab 12 and associated extension 14 are composed of a conductive layer 22 of electrically conductive material such as copper and a plating layer 24 of electrically conductive and inoxidizable material such as gold. Dummy pads 20 have substantially the same width as tabs 12 (or may be narrower than tabs 12), and are formed below respective tabs 12 and extensions 14 in such a manner that pads 20 are buried under (covered by) insulating layer 26.

Printed wiring board 10 may include a base substrate such as a glass fiber-reinforced epoxy board. The base substrate may be provided with flexibility. A first wiring layer including a predetermined circuit pattern is formed on the base substrate, and then the insulating layer is formed on the first wiring layer. Then, a second wiring layer with a predetermined circuit pattern is formed on the insulating layer. The second wiring layer is electrically connected to the first insulating layer through photo vias formed in the insulating layer. In this way, necessary wiring layers and insulating layers are built up one after another, resulting in what is referred to in the industry as a built-up or multi-layered circuit board.

Figure 2:
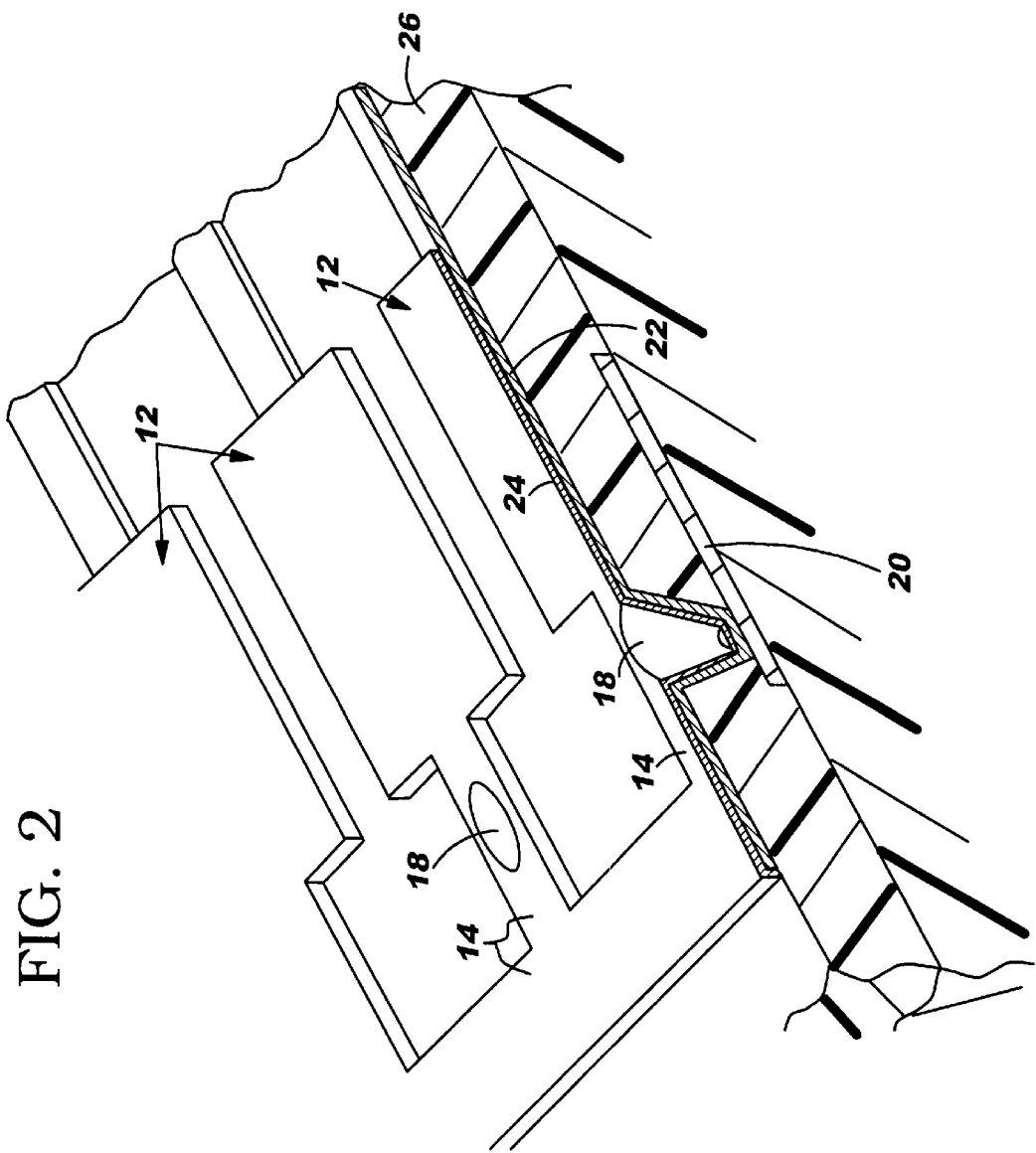
FIG. 2 is an enlarged perspective view illustrating a part of the process of producing the printed wiring board shown in FIG. 1.
Figure 3:
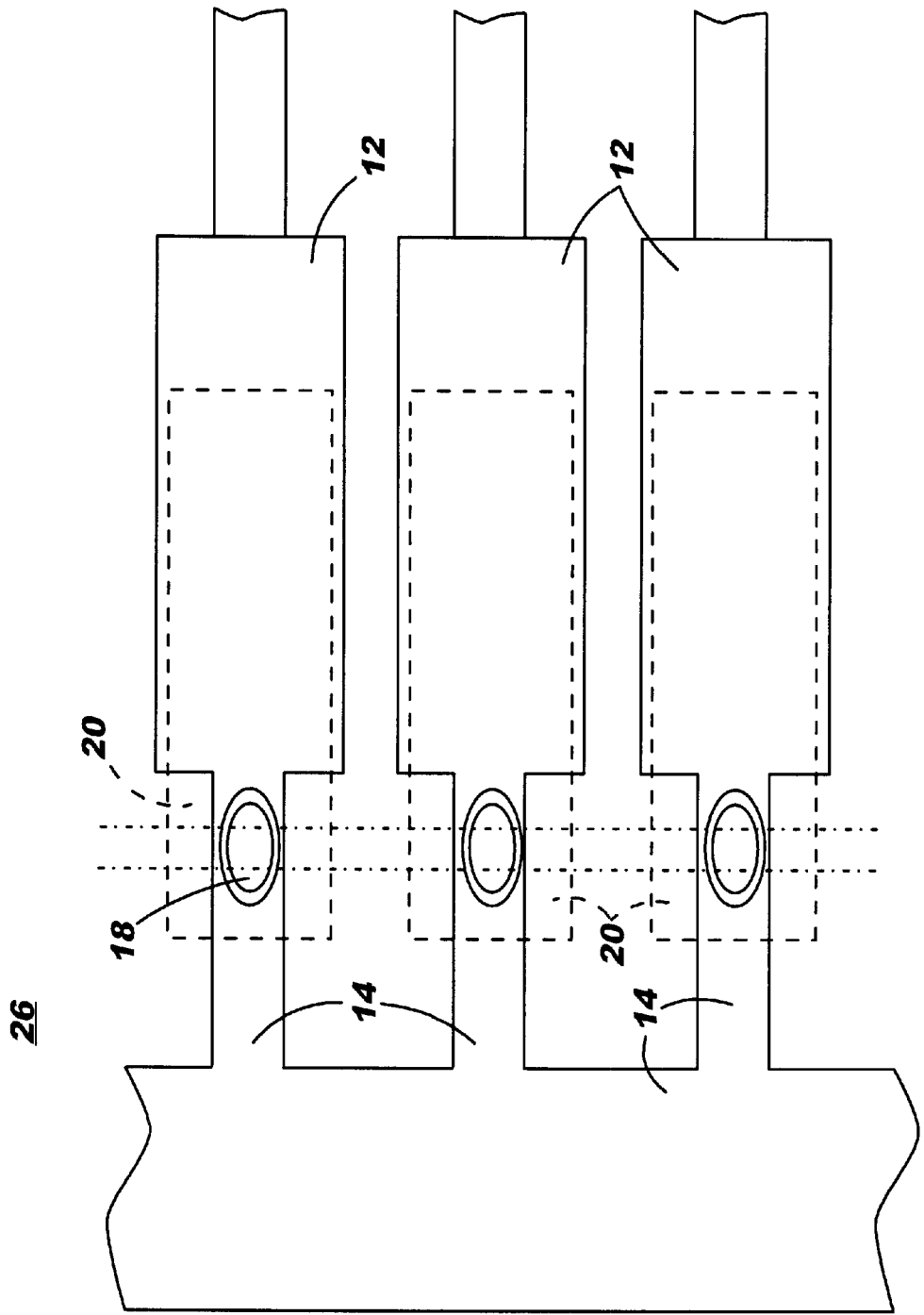
FIG. 3 is an enlarged plan view illustrating one embodiment of the process of producing the printed wiring board shown in FIG. 1.

On the surface of insulating layer 26, tabs 12 and extensions 14 are formed, as shown in FIGS. 2 and 3. When a wiring layer is formed under insulating layer 26, dummy pads 20 are formed at the same time. Although these dummy pads 20 are electrically insulated from each other and from the wiring layer on its shared surface, it is possible to establish an electrical connection between the upper wiring layer and the tabs through dummy pads 20. Insulating layer 26 is preferably made of photosensitive resin in which photo vias are formed in predetermined positions where recesses 18 are to be formed. Dummy pads 20 are exposed at the bottoms of the photo vias. Recesses 18 may also be formed using a laser ablation. In this case, insulting layer 26 is not necessarily made of photosensitive resin.

Conductive layer 22 is deposited over insulating layer 26, e.g., by electroless plating, electrolytic plating, or other deposition techniques. Conductive layer 22 is preferably made of a metal such as copper, and is joined to dummy pads 20 at the bottoms of the photo vias. Conductive layer 22 is formed then into a circuit pattern including tabs 12 and extensions 14, preferably by photoetching. Further, using patterned conductive layer 22 as an electrode, electrically conductive and inoxidizable material such as gold and palladium is deposited on layer 22, e.g., by electrolytic plating, to form plated conductive layer 24. In this case, the remaining surface of patterned conductive layer 22 (except tabs 12 and extensions 14) is coated with plating resist so as not to form plating layer 24 thereon. Since most of the extensions 14 are cut away in a next cutting step, some of the plating metal deposited on the full length of extensions 14 will be wasted. Therefore, the portions of the extensions which will be cut away in a later step may also be coated with plating resist so as not to be plated with the more precious (and expensive) gold or palladium metal.

Figure 15:
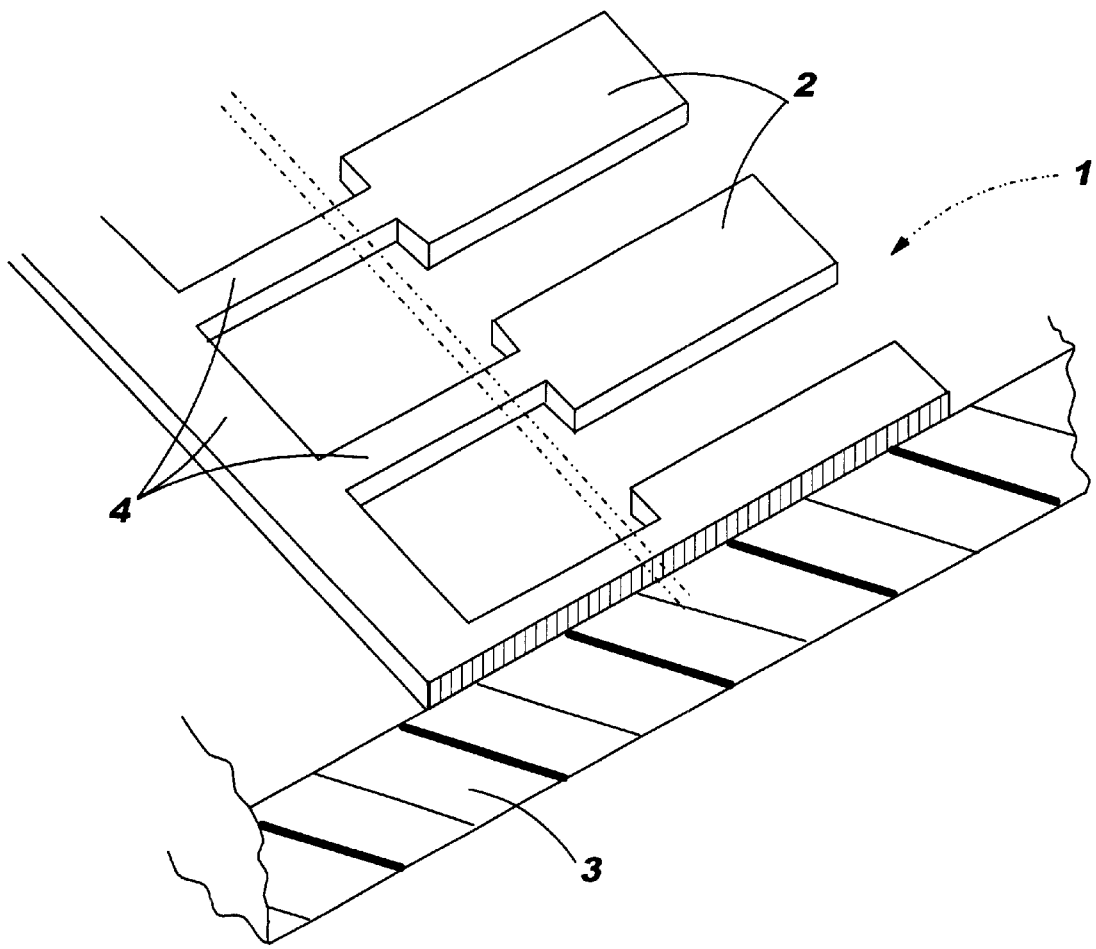
FIG. 15 is an enlarged perspective view for illustrating a process of producing a conventional printed wiring board.
Figure 16:
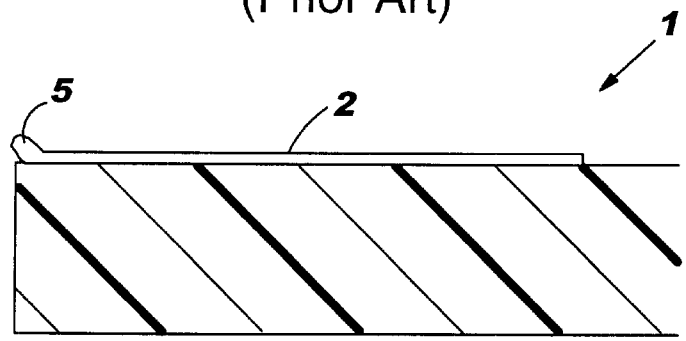
FIG. 16 is an enlarged side view for illustrating a problem of a conventional printed wiring board.

Printed wiring board 10 shown in FIG. 1 is cut from a larger panel. As shown in FIG. 3, the board is cut along the dotted lines which pass through recesses 18 formed in extensions 14. These lines are oriented vertically in FIG. 3 to illustrate the approximate width of the cut. The resulting cross-section is shown in FIG. 1. Tabs 12 of printed wiring board 10 are cut along recesses 18 so that most of the swarf and burrs from the cutting are left in the recesses, not on the upper surfaces of the tabs. Furthermore, since end portions of tabs 12 are joined to dummy pads 20 buried under insulating layer 26, the mechanical strength of the formed conductors is increased over tab structures such as shown in FIGS. 15 and 16. Thus, the adhesive strength of tabs 12 to insulating layer 26 is increased and the extensions 14 are not peeled from insulating layer 26 when the printed board 10 is cut. Further, the severed tabs are not peeled from insulating layer 26 when printed wiring board 10 is plugged into a socket connector. Therefore, the reliability of the printed wiring board as produced by the teachings herein is enhanced.

In the above embodiment, a plan view of the photo via (recess 18) may be circular, but it is preferably an ellipse (or oval) having a major axis in the direction of extension 14. See FIG. 3. Furthermore, the plan view of the photo via may also be rectangular having two longer sides in the direction of extension 14, or it may be a polygon, also having a diagonal line in the direction of extension 14. Thus, the cross-sectional shape photo via is not limited to the specific embodiment in FIG. 3. In the case of the photo via (recess 18) having longer sides (or a majority axis) in the direction of extension 14, it has been found that even if slight error (e.g., offset) in the cutting position occurs, a strong resulting structure is still possible.

Figure 4:
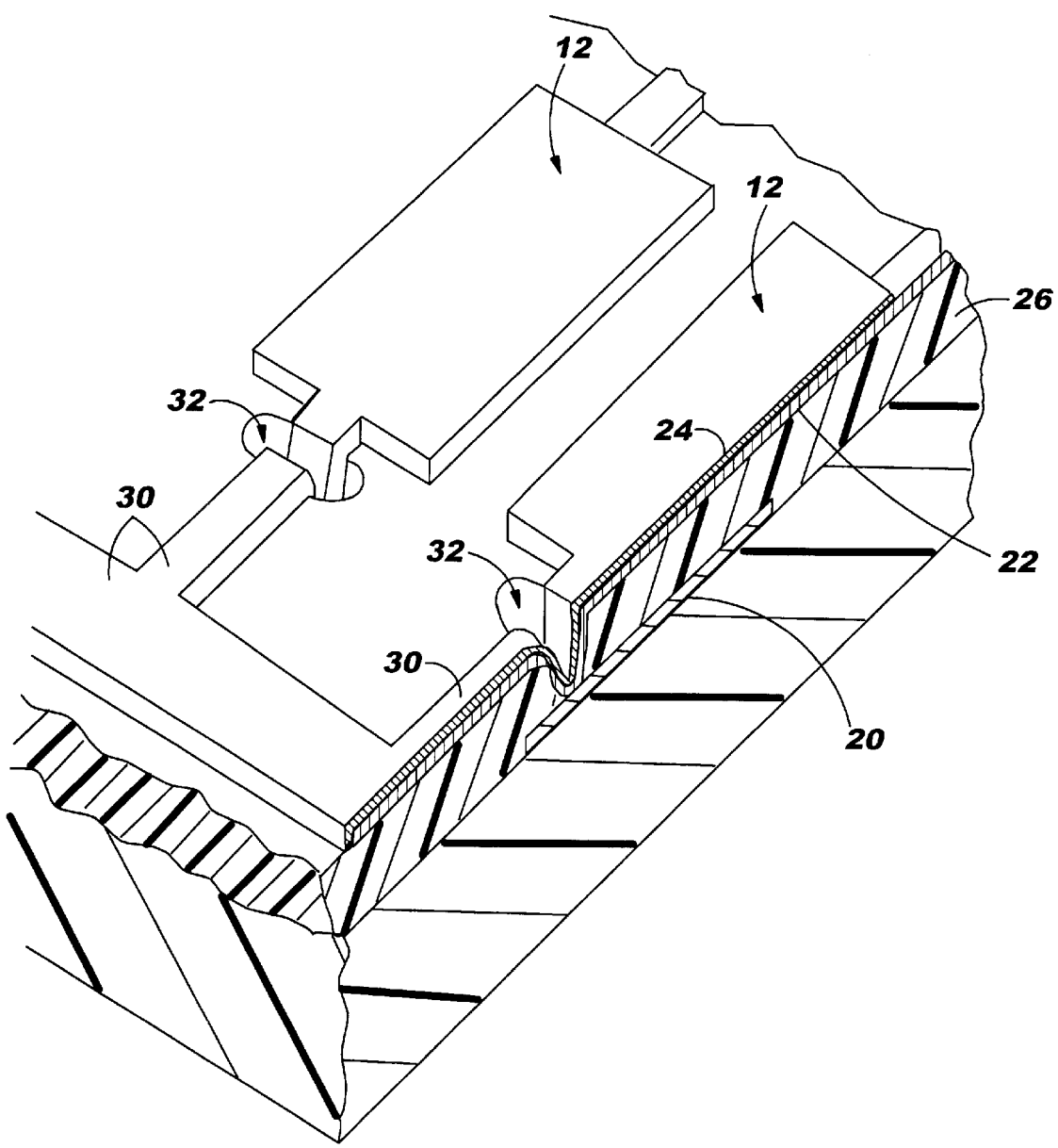
FIG. 4 is an enlarged perspective view illustrating another embodiment of the process of producing a printed wiring board according to the present invention.
Figure 5:
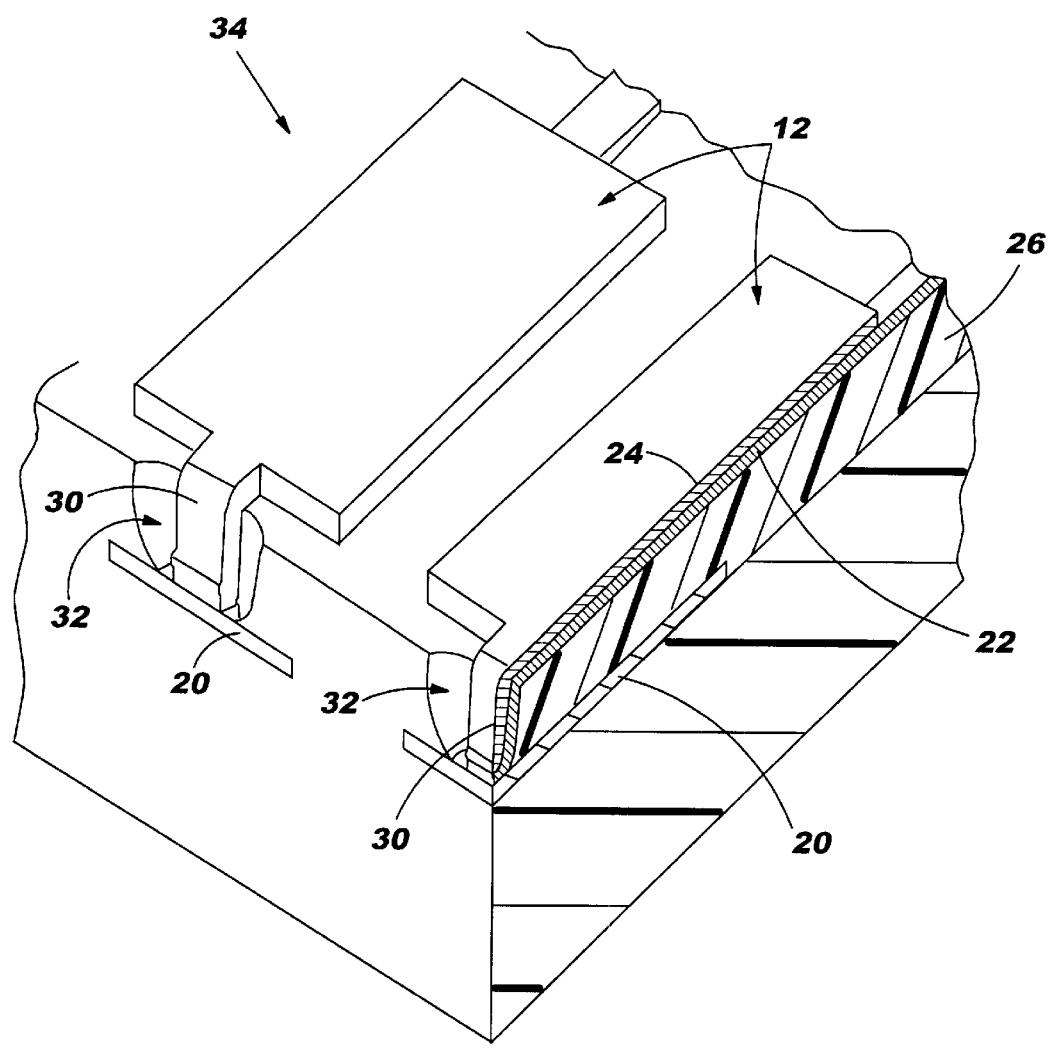
FIG. 5 is an enlarged perspective view of a portion of the printed wiring board produced by the process partially shown in FIG. 4.

The present invention is not limited to the above embodiment wherein the recess longer dimension lies in the direction of the formed extensions. For example, recesses 32 may be larger in a direction normal to the end direction. Specifically, as shown in FIG. 4, the recesses 32, preferably formed by photoetching, are larger in width than the corresponding extensions 30, to the extent that the extensions 30 are formed within recesses 32. Then, as shown in FIG. 5, printed wiring board 34 is produced by cutting the panel along a predetermined line which passes through recesses 32 and which will become an outline of a printed wiring board, in the same manner as described above. In printed wiring board 34, each tab 12 has an associated extension portion 30 at the end thereof. Extension 30 dips within the corresponding recess 32, and is joined to dummy pad 20 in the recess. Since the cut surface of extension 30 is through recess 32, swarf and burrs are not left on the upper surface of tab 12, but will remain in recess 32.

Figure 17:
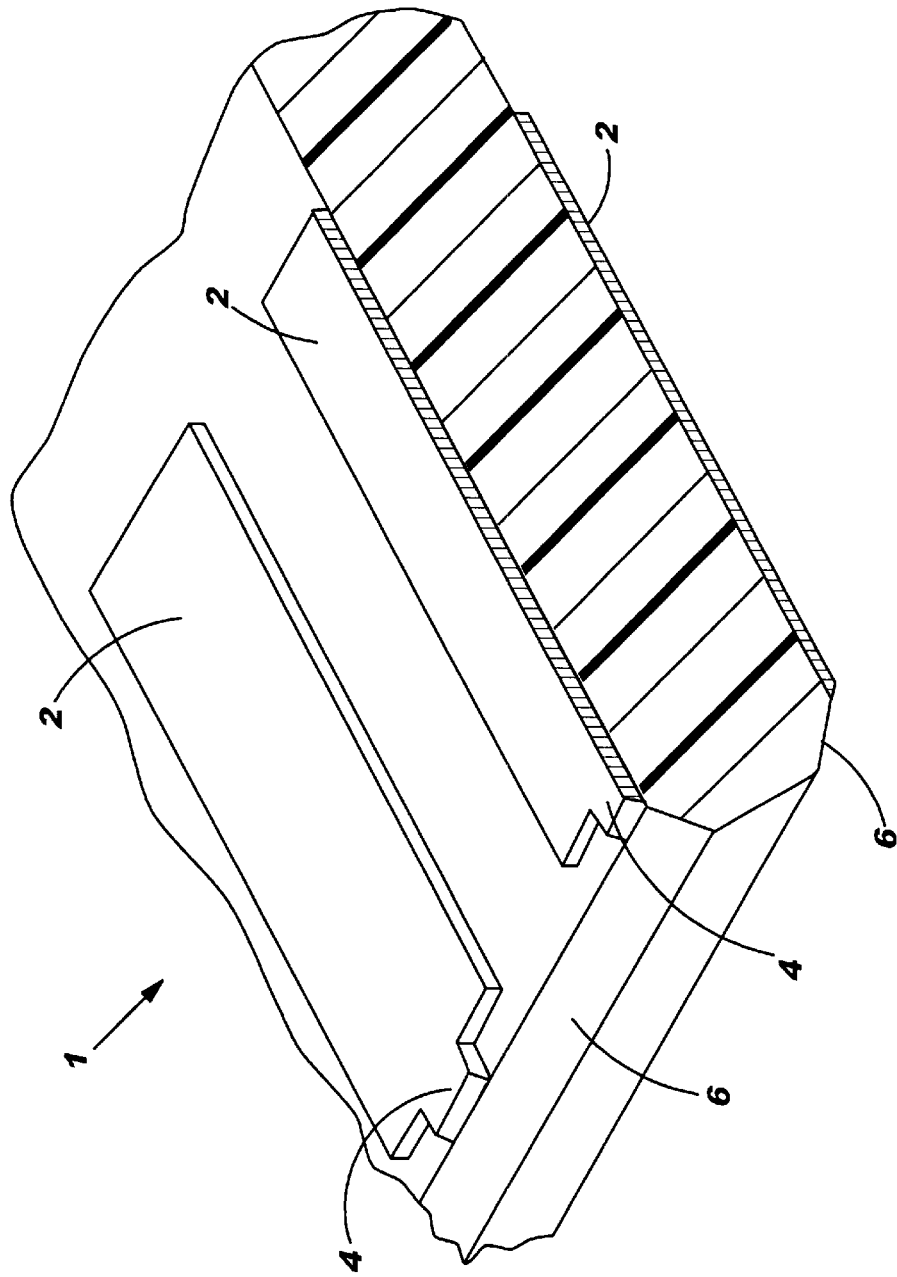
FIG. 17 is an enlarged perspective view for illustrating a process of beveling a conventional printed wiring board.

In the above embodiment, recesses 32 are formed separately from one another in correspondence with the respective extensions 30 of tabs 12. However, these recesses 32 can be merged into a single groove-like recess. Such a groove-like recess may be formed by a photoetching process, but may also be formed using laser ablation. By forming a groove-like recess, an end surface of the printed wiring board can be shaped to have a beveled surface such as shown in FIG. 17. See the groove-like recess in FIG. 8. Therefore, the tabs of the printed wiring board of the present invention can be readily plugged into a socket connector with less force than tabs of a conventional printed wiring board.

Figure 6:
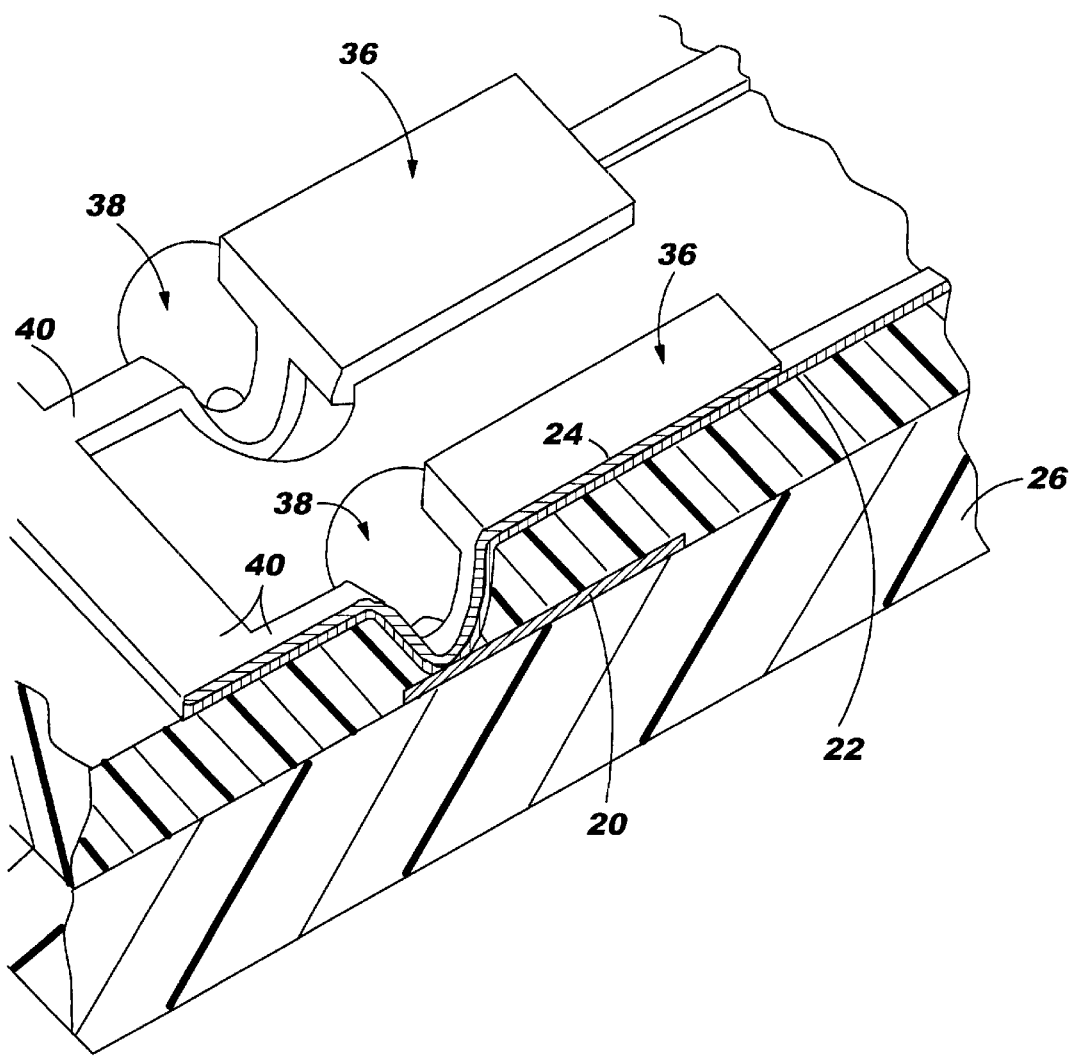
FIG. 6 is an enlarged perspective view illustrating another embodiment of a process of producing a printed wiring board according to the present invention.
Figure 7:
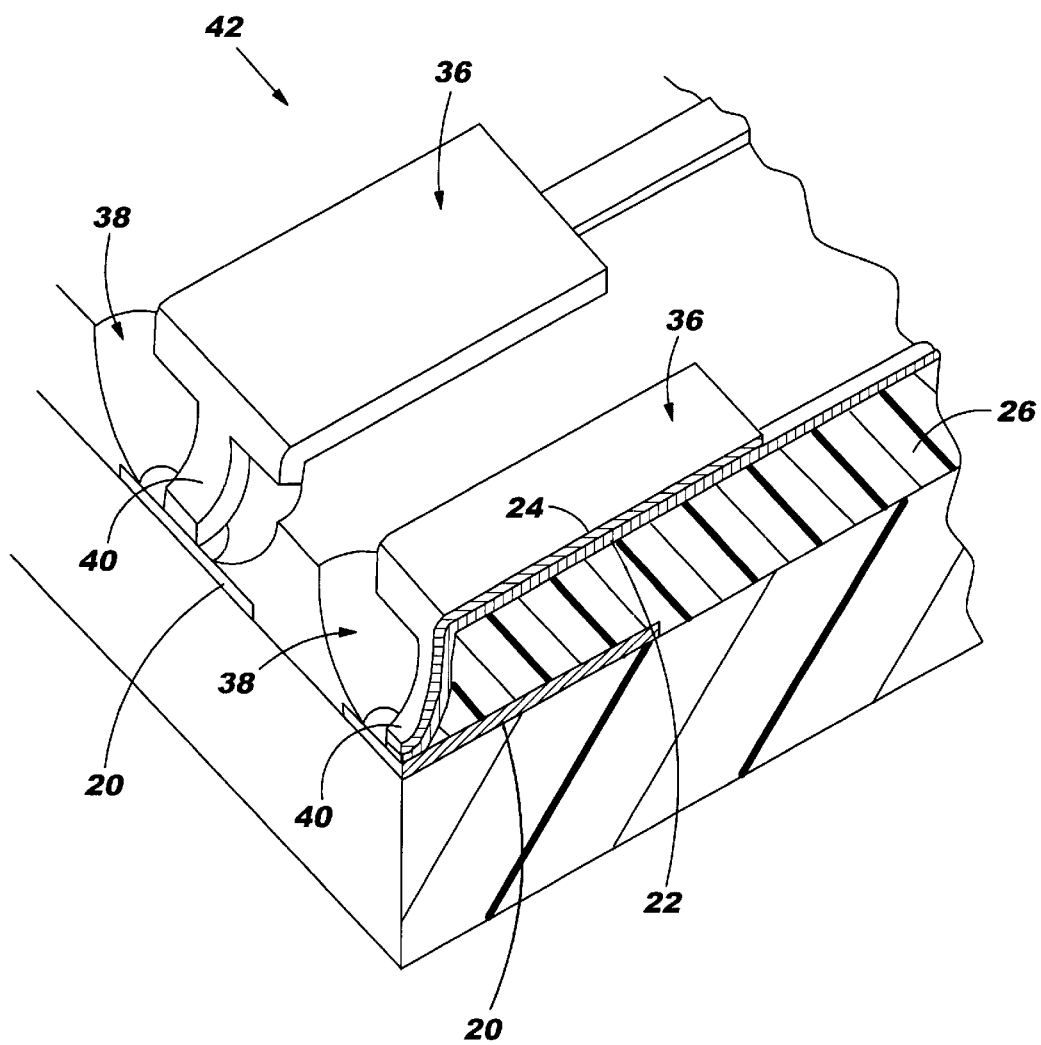
FIG. 7 is an enlarged perspective view of a portion of the printed wiring board produced by the production process partially shown in FIG. 6.

As shown in FIGS. 6 and 7, large recesses 38 can be formed near the end portions of tabs 36 so that not only extensions 40 but also the end portions of tabs 36 will reside in the recesses 38. Specifically, recesses 38 are formed in insulating layer 26 in such a manner that recesses 38 become wider than extensions 40 and tabs 36, and the end portions of tabs 36 extend into the recesses. In this case, a part of each extension 40 or a part of each tab 36 is joined to dummy pad 20 buried in the insulating layer. Recesses 38 are formed by the same method as described in the above embodiment. Printed wiring board 42 is produced by cutting the panel along a predetermined line which passes through all the recesses and which will become an outline of the printed wiring board, as shown in FIG. 7.

Printed wiring board 42 of FIG. 7 has the same advantageous features as described in the above embodiments. Furthermore, the end portions of tabs 36 are bent in an inwardly slanting direction and fall into respective recesses 38, which may produce the same effect as in the case where end portions of the tabs are beveled. Therefore, printed wiring board 42 can also be relatively easily plugged into a socket connector with no tab peeling occurring. Such a shape for the resulting tabs is more effective when printed wiring board 42 is thicker than in the preceding embodiments.

Figure 8:
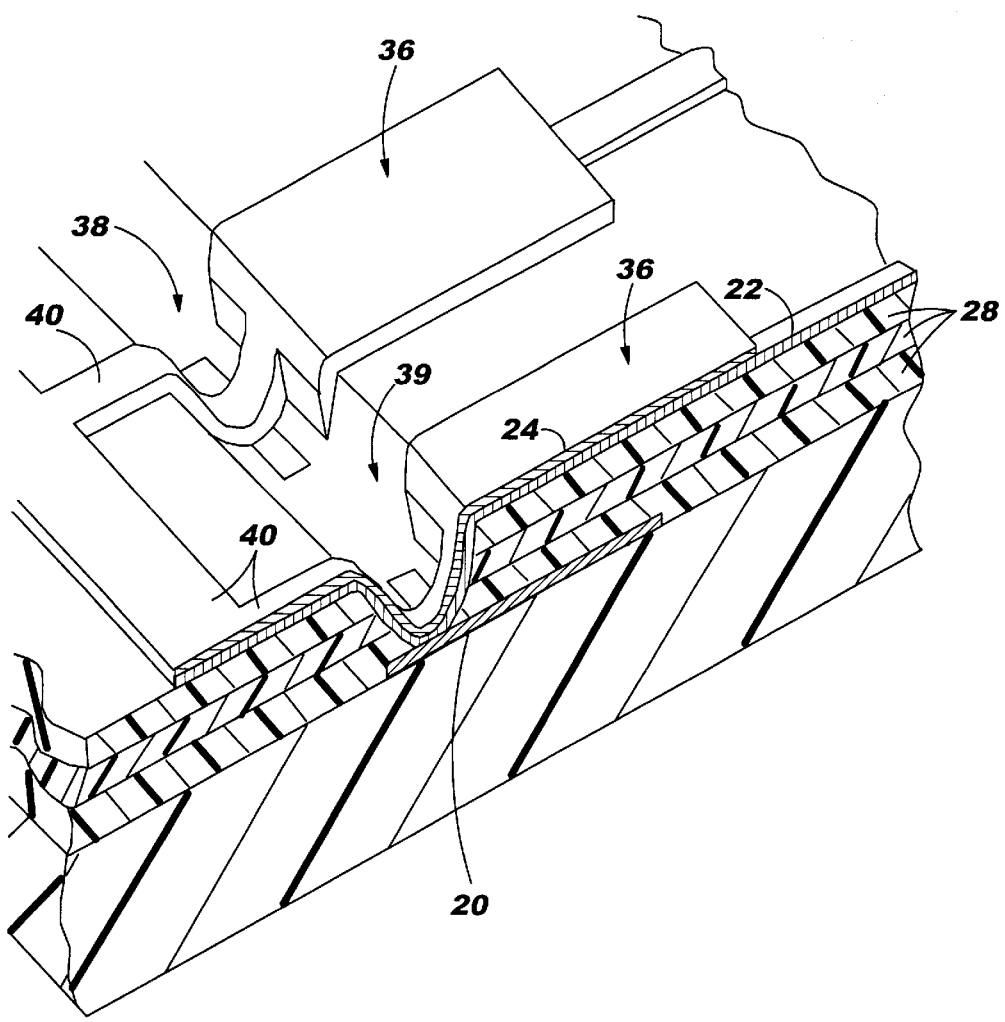
FIG. 8 is an enlarged perspective view illustrating yet a further embodiment of a process of producing a printed wiring board according to the present invention.
Figure 9:
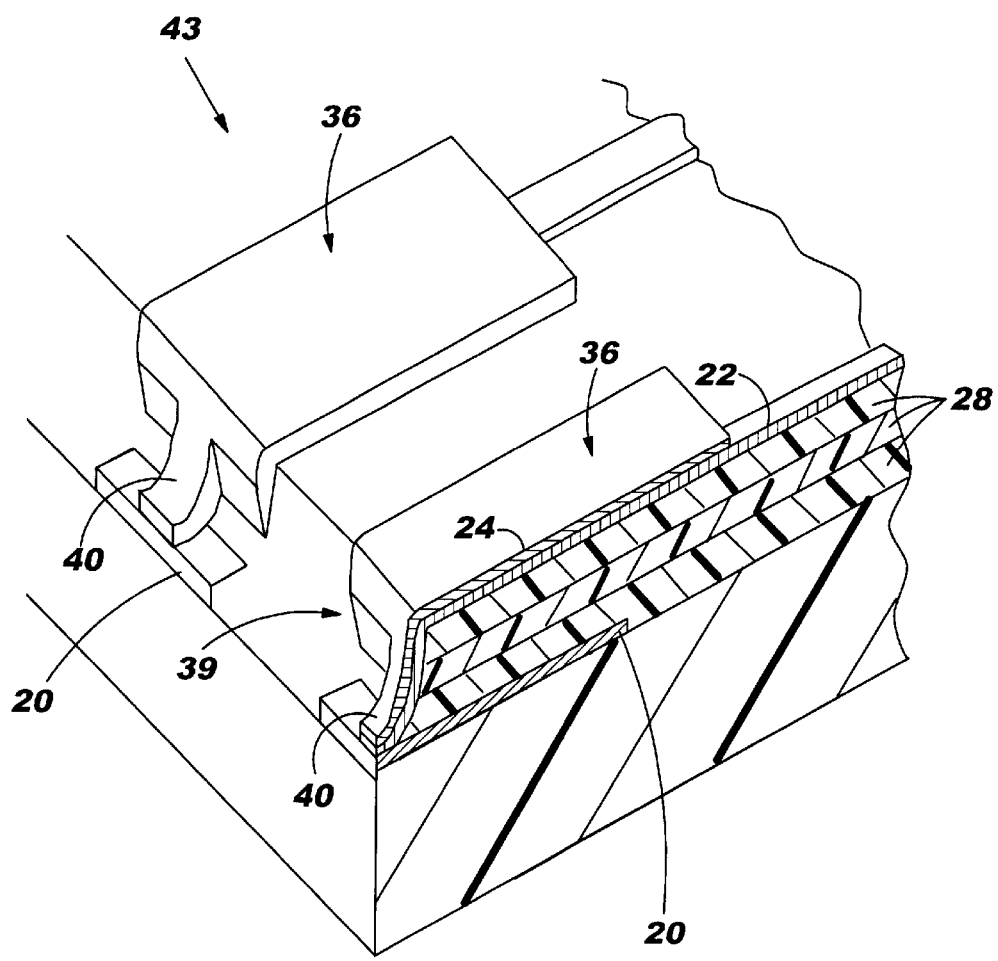
FIG. 9 is an enlarged perspective view of a portion of the printed wiring board produced by the production process partially shown in FIG. 8.

In the above embodiment, recesses 38 are formed separately from each other. However, these recesses 38 can be merged into a groove-like recess as shown in the embodiment of FIG. 8. Also, dummy pads 20 may be formed under a plurality of insulating layers 28 which constitute a build-up type multilayer wiring structure, as shown in FIG. 8. A groove 39 is formed so that dummy pad 20 is partially exposed thereto prior to circuit tabs being coupled thereto. In this case, groove 39 is preferably formed using a laser and includes inclined side wall surfaces. Then, a top wiring layer with a predetermined circuit pattern, which comprises tabs 36 and extensions 40, is formed in the same manner as described hereinabove. In a final step, printed wiring board 43 is produced by cutting the panel at the bottom of groove 39 where dummy pads 20 and tabs 40 are joined, as shown in FIG. 9. By forming groove 39 as shown in FIG. 9, the end face of printed wiring board 43 includes a beveled or the like shape. Therefore, tabs 36 of printed wiring board 43 can be plugged into a socket connector with less force than tabs of a conventional printed wiring board.

Figure 10:
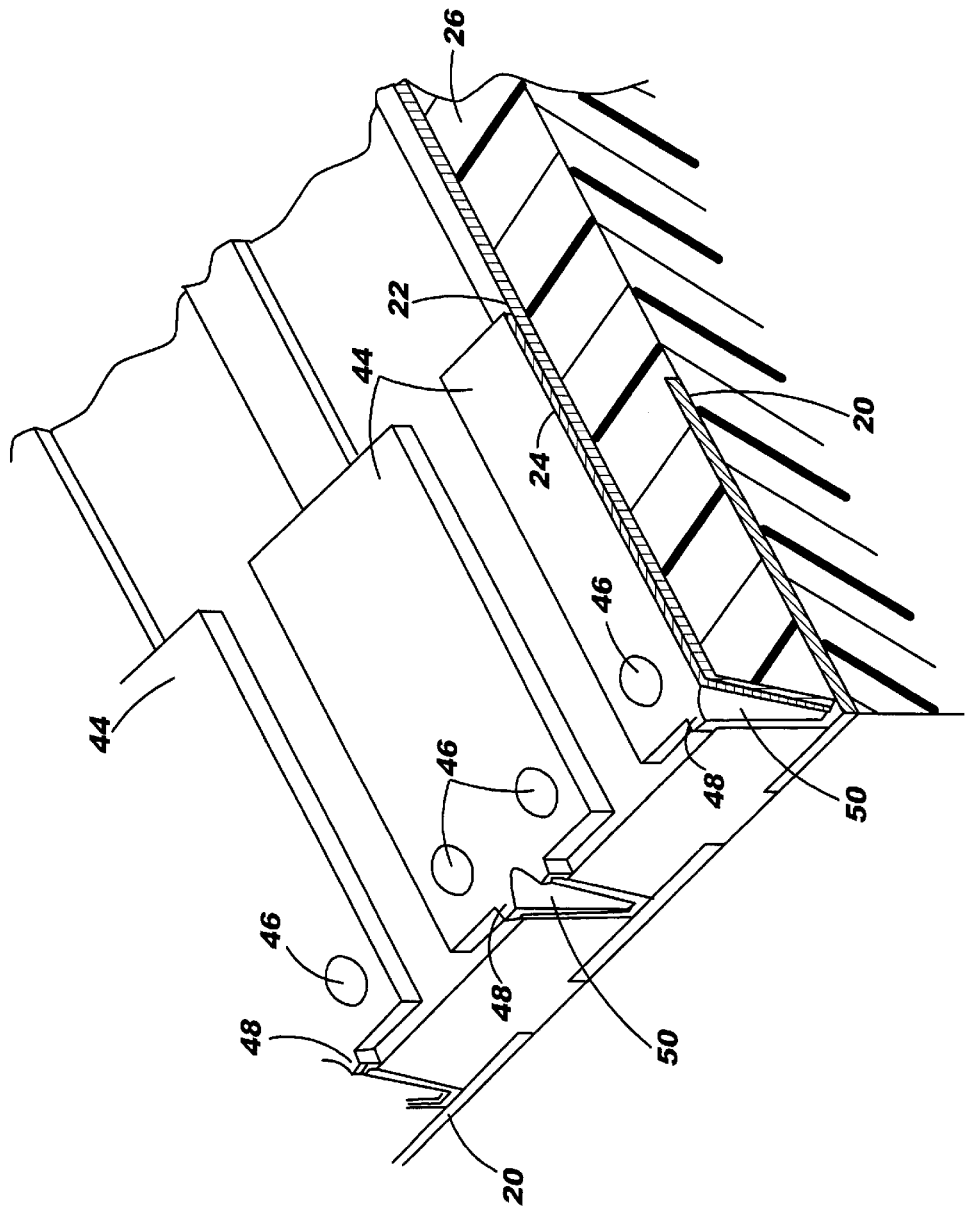
FIG. 10 is an enlarged perspective view showing still another embodiment of a printed wiring board according to the present invention.
Figure 11:
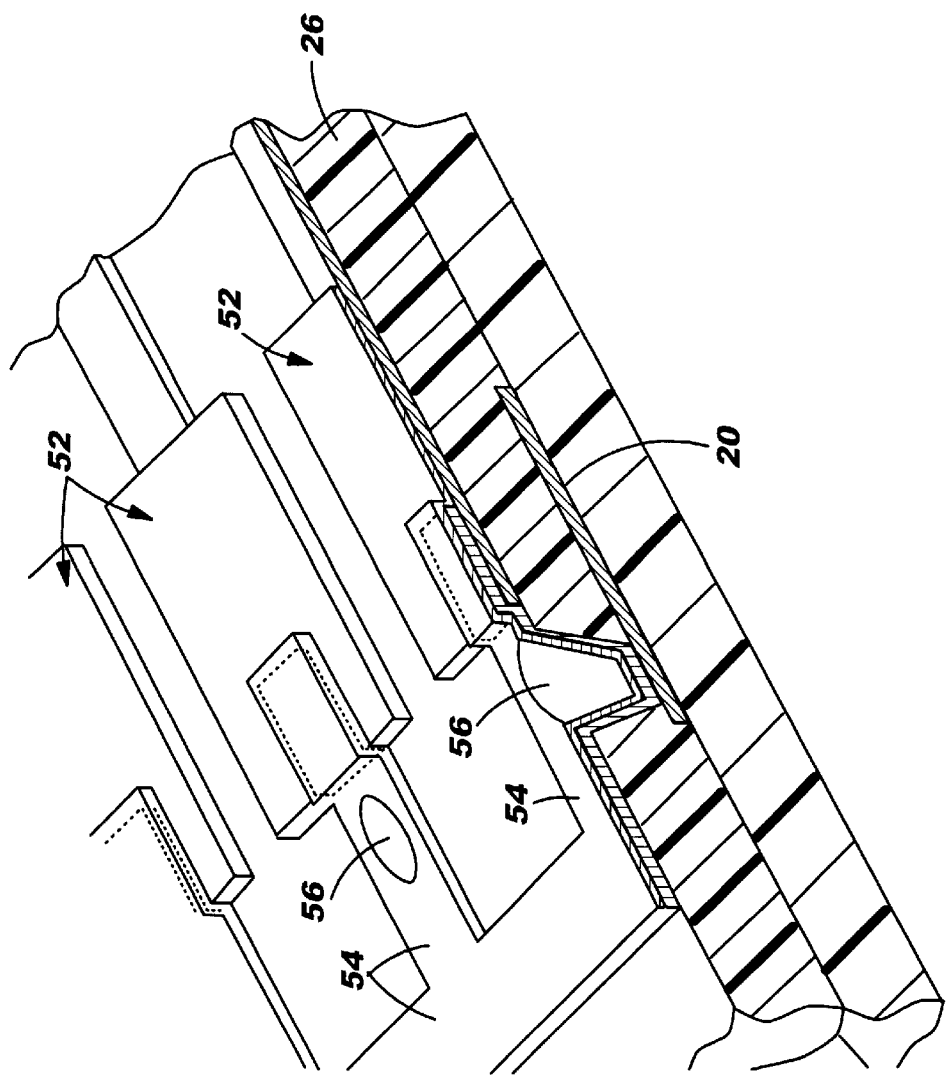
FIG. 11 is an enlarged perspective view showing another embodiment of a printed wiring board according to the present invention.

The number of recesses formed for each tab is not limited to one, as a plurality of recesses may be formed instead for each tab. For example, two recesses 46 can be formed at the end portion of one tab 44, and one recess 50 can be formed in one extension 48, as shown in FIG. 10. At the bottoms of recesses 46, and 50, conductive layers 22 (tabs 44) are joined to dummy pads 22. Thus, by joining both extension 48 and tab 44 to dummy pad 20 through recesses 46 and 50, higher bonding strength of the tabs to dummy pads 20 is ensured, and thereby the peeling of tabs 44 from insulating layer 26 is substantially prevented. The position of recesses 46 is not limited to the end portion of tab 44. Any number of recesses 46 can be formed almost anywhere within tab 44. The number and the position of such recesses may depend on the desired shape of the tab. Although the tabs and extensions are integrally formed in the above embodiments, these may be formed separately as well. For example, as shown in FIG. 11, after forming one-layer tabs 52 made of copper or the like on insulating layer 26, one-layer extensions 54 made of copper or the like are formed in such a manner that extensions 54 overlap with tabs 52. In this case, it is preferable to form recesses 56 in insulating layer 26 before forming tabs 52. (However, it is also possible to form recesses 56 in insulating layer 26 after forming tabs 52.) In either case, extensions 54 are formed over recesses 56, and joined to dummy pads 20 buried in insulating layer 26 at the bottoms of recesses 56. Then, tabs 52 and extensions 54 are plated with gold or the like, and subsequently the substrate is cut along a line passing through recesses 56 in the same manner as described above.

Figure 12:
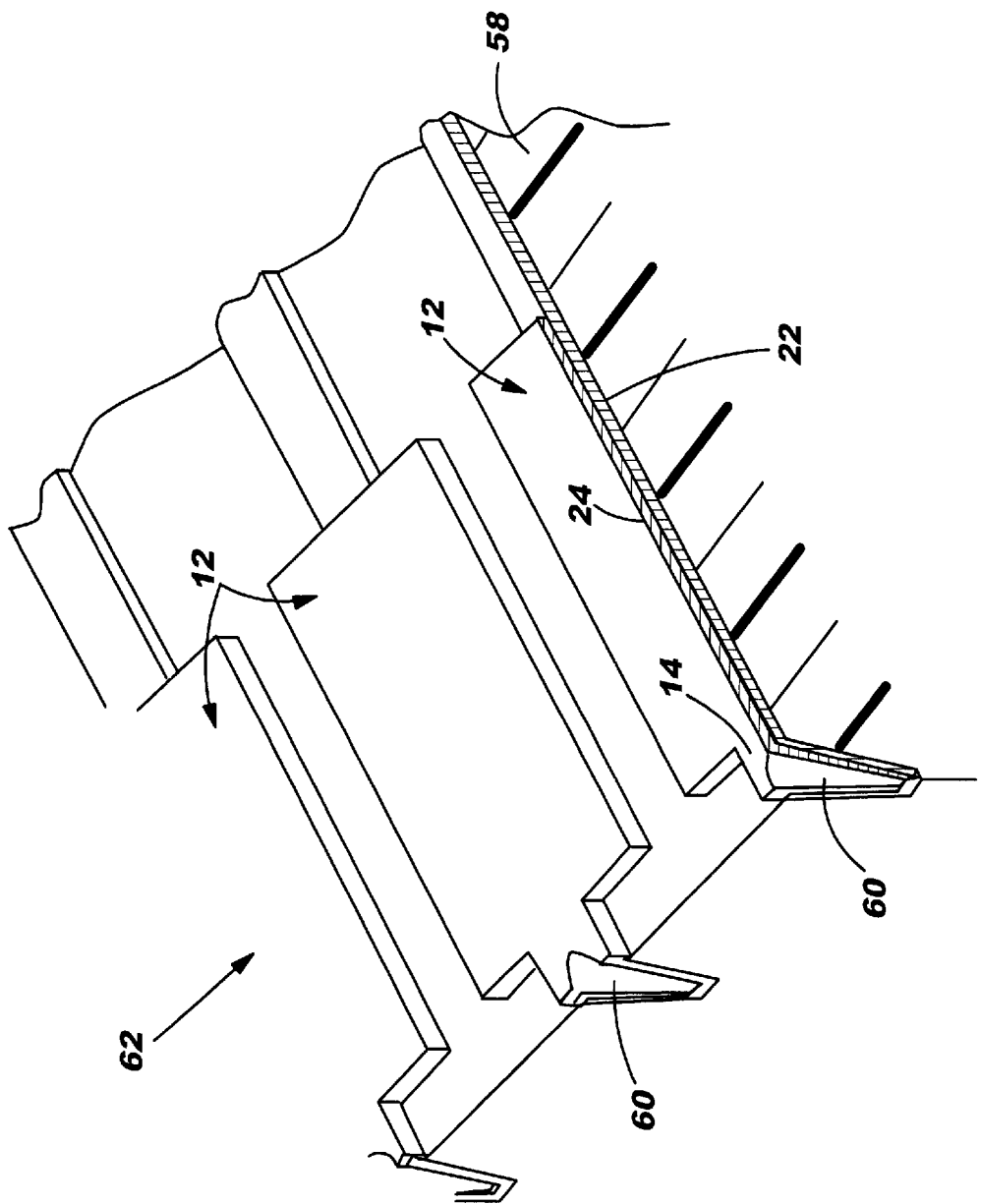
FIG. 12 is an enlarged perspective view showing a further embodiment of a printed wiring board according to the present invention.
Figure 13:
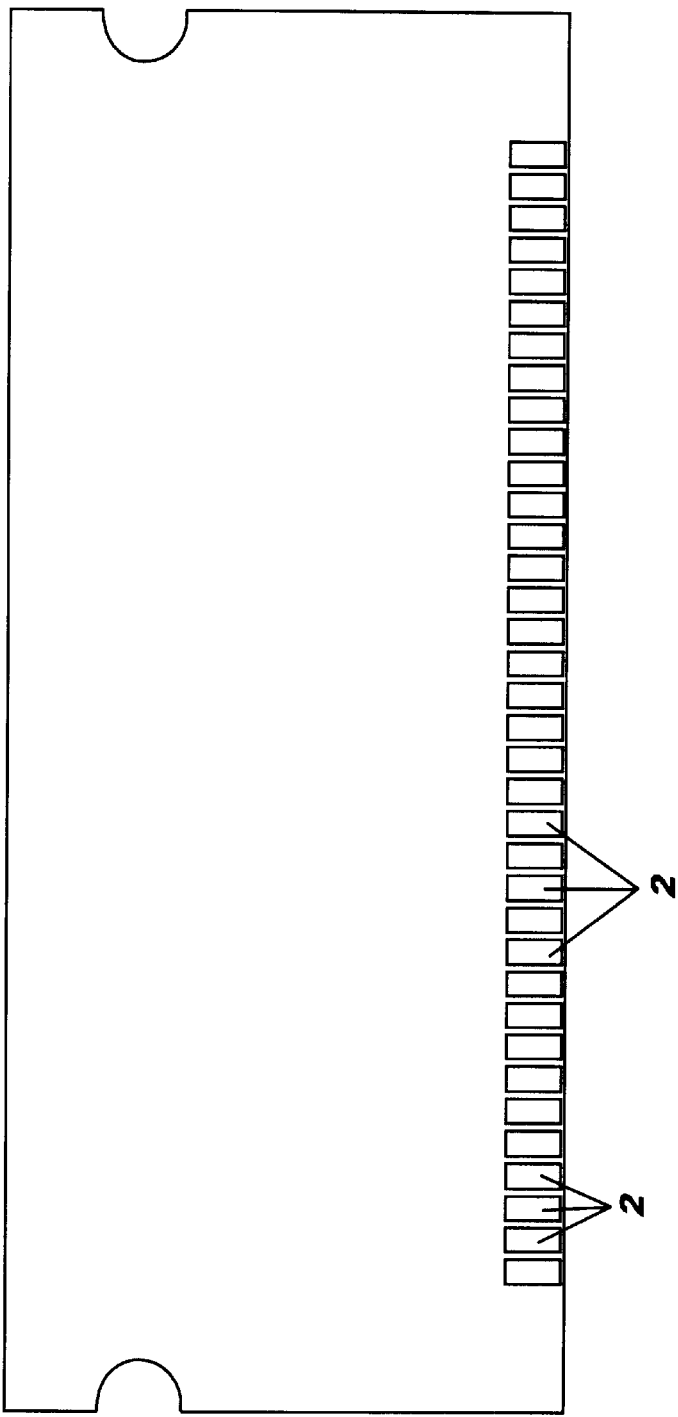
FIG. 13 is an enlarged front view showing an example of a printed wiring board with tabs formed thereon.
Figure 14:
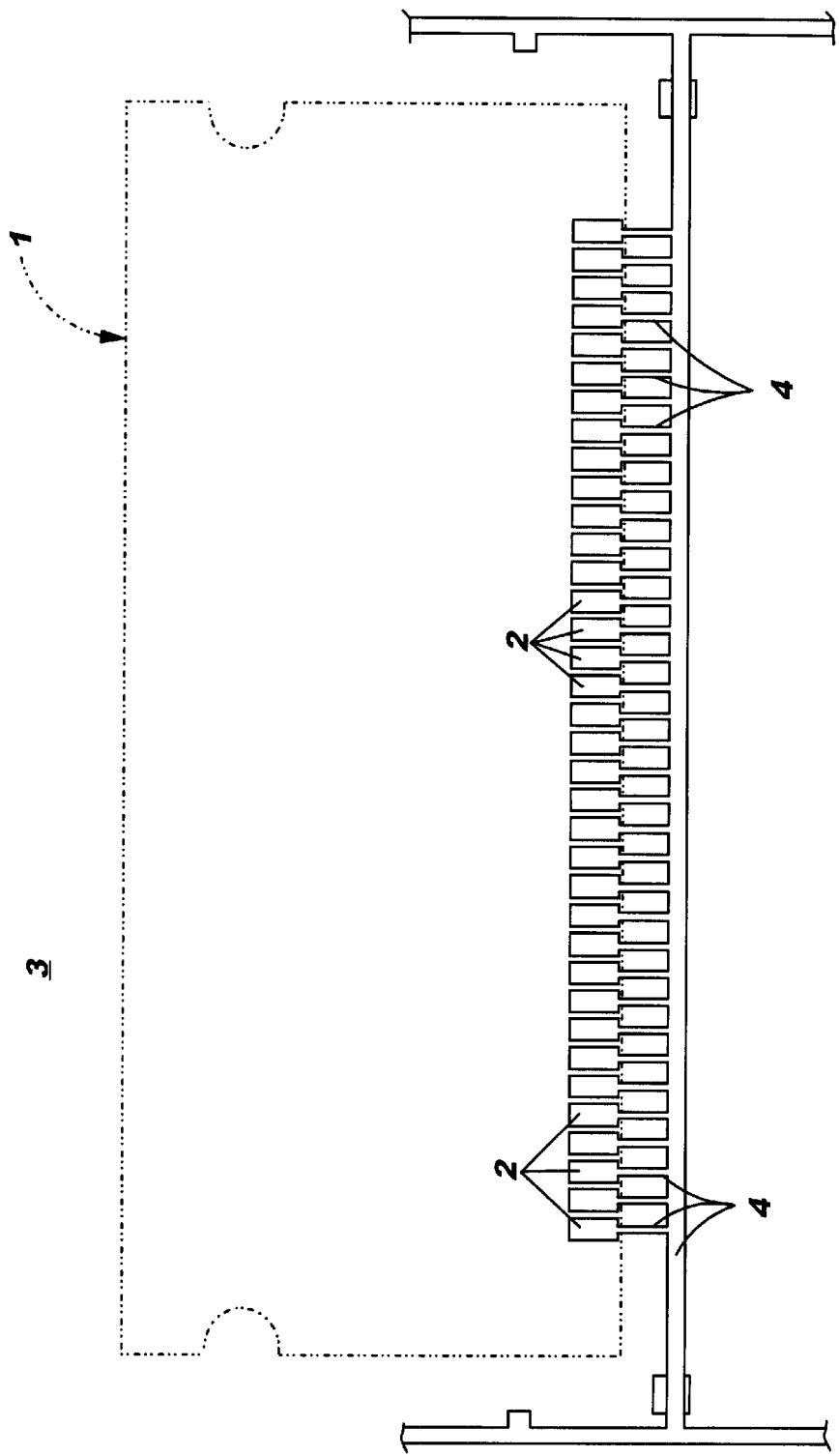
FIG. 14 is an enlarged front view for illustrating a process of producing the printed wiring board shown in FIG. 13.

In the case of a single-layer printed wiring board, it may be possible to form recesses 60 in predetermined portions of the insulating base substrate 58, as shown in FIG. 12. In printed wiring board 62, extensions 14 connected to tabs 22 extend into recesses 60.

While various embodiments of the present invention have thus been described with reference to the accompanying drawings, it will be understood by those skilled in the art that the present invention be not limited to the embodiments shown in the drawings. For example, the printed wiring board of the present invention is not limited to the single-sided printed wiring board shown in the accompanying drawings, but it may also be a double-sided printed wiring board with circuitry, recesses, etc., provided on the opposite side of the underlying substrate. Furthermore, the printed wiring board of the present invention is not limited to having tabs on only one side, as shown, but may also have tabs on both sides. In the case of a printed wiring board having tabs on one side, dummy pads can be formed on the opposite side and joined to the tabs via through-holes. These through-holes are formed in the same position as the aforementioned recesses are formed.

In a preferred embodiment, the width of the extensions at those portions where the recesses are formed has been shown to be narrower than the corresponding tabs from which the extensions project. However, the width of the extensions at those portions may be substantially equal to that of the tabs. In such case, the combination of a tab and its associated extension left after cutting may be seen as a single tab. It is also to be noted that the extension left after cutting acts functionally as a part of the tab.

The materials for the printed wiring board of the present invention are not particularly limited. In addition, various changes, modifications, and improvements can be made in the embodiments on the basis of knowledge of those skilled in the art without departing from the scope of the present invention.

What is claimed is:

1. A printed wiring board for being plugged into a socket connector, said printed wiring board connector comprising:
    an insulating layer having a first surface with a plurality of recesses therein, said recesses being formed along a predetermined edge portion of said insulating layer to extend through at least a portion of said insulating layer, said edge portion adapted for being plugged into said socket connector;

a plurality of conductive tabs for establishing an electrical connection with an external electronic apparatus, selected ones of said tabs being formed on said surface of said insulating layer relative to a corresponding one of said recesses and adapted for being connected to said socket connector when said edge portion is plugged into said socket connector;

a plurality of pads positioned on an opposite surface of said insulating layer from said first surface having said plurality of conductive tabs thereon; and a plurality of conductive extensions located substantially on said first surface of said insulating layer and being connected electrically to respective ones of said conductive tabs and extending into respective ones of said recesses and firmly mechanically connected to said pads on said opposite surface of said insulating layer to substantially prevent peeling of said conductive tabs during said plugging of said edge portion into said socket connector.

2. The printed wiring board according to claim 1 wherein said pads being located on said opposite surface of said insulating layer are dummy pads.

3. The printed wiring board according to claim 1, wherein said recesses are narrower than said conductive extensions.

4. The printed wiring board according to claim 3, wherein said recesses have a cross-sectional shape of an ellipse or oval having a major axis in the direction of said extension.

5. The printed wiring board according to claim 1, wherein each of said selected ones of said conductive tabs has at least one recess formed therein.

6. The printed wiring board according to claim 1 wherein said conductive extensions are each comprised of two conductive layers.

7. The printed wiring board according to claim 6 wherein the first of said conductive layers is copper and the second of said conductive layers is gold.

* * * * *